United States Patent
Hou

(10) Patent No.: US 8,550,150 B2
(45) Date of Patent: Oct. 8, 2013

(54) LOOP HEAT PIPE

(75) Inventor: Chuen-Shu Hou, Taipei Hsien (TW)

(73) Assignee: Foxconn Technology Co., Ltd., New Taipei (TW)

( * ) Notice: Subject to any disclaimer, the term of this patent is extended or adjusted under 35 U.S.C. 154(b) by 932 days.

(21) Appl. No.: 12/650,576

(22) Filed: Dec. 31, 2009

(65) Prior Publication Data

US 2011/0088875 A1    Apr. 21, 2011

(30) Foreign Application Priority Data

Oct. 16, 2009    (CN) .......................... 2009 1 0308391

(51) Int. Cl.
*F28D 15/00*    (2006.01)
*H05K 7/20*    (2006.01)

(52) U.S. Cl.
USPC .................. 165/104.26; 165/104.21; 361/700

(58) Field of Classification Search
USPC ...... 165/104.21, 104.26, 80.4, 80.5; 361/700
See application file for complete search history.

(56) References Cited

U.S. PATENT DOCUMENTS

| | | | |
|---|---|---|---|
| 6,269,866 B1 | 8/2001 | Yamamoto et al. | |
| 6,889,756 B1 * | 5/2005 | Hou | ......................... 165/104.33 |
| 7,143,818 B2 * | 12/2006 | Thayer et al. | ............. 165/104.26 |
| 7,246,655 B2 | 7/2007 | Mochizuki et al. | |
| 7,540,319 B2 | 6/2009 | Mochizuki et al. | |
| 2003/0173068 A1 * | 9/2003 | Davies et al. | .................. 165/170 |
| 2006/0037737 A1 * | 2/2006 | Chen et al. | ............... 165/104.26 |
| 2006/0272798 A1 * | 12/2006 | Liu et al. | ................... 165/104.33 |
| 2007/0163755 A1 * | 7/2007 | Kim et al. | ................. 165/104.26 |
| 2008/0078530 A1 * | 4/2008 | Chang et al. | .............. 165/104.26 |
| 2008/0117637 A1 * | 5/2008 | Chang et al. | ................... 362/294 |
| 2008/0277099 A1 * | 11/2008 | Takamatsu et al. | ....... 165/104.26 |
| 2008/0283223 A1 * | 11/2008 | Chang et al. | .............. 165/104.26 |
| 2009/0314472 A1 * | 12/2009 | Kim et al. | ................. 165/104.26 |
| 2010/0300656 A1 | 12/2010 | Lu et al. | |

FOREIGN PATENT DOCUMENTS

| | | |
|---|---|---|
| CN | 1703142 A | 11/2005 |
| CN | 1789879 A | 6/2006 |
| CN | 101059321 A | 10/2007 |
| WO | WO 2008138216 A1 * | 11/2008 |

* cited by examiner

*Primary Examiner* — Allen Flanigan
*Assistant Examiner* — Jason Thompson
(74) *Attorney, Agent, or Firm* — Altis Law Group, Inc.

(57) ABSTRACT

An exemplary loop heat pipe includes a plate-type evaporator, a pipe, a condenser thermally connected with the pipe and a working medium contained in the closed loop. The plate-type evaporator defines an exit for vapor in a lateral portion thereof and an entrance for liquid in a top portion thereof. The pipe connects the exit and the entrance to form a closed loop. A first wick structure has a lower end thereof attached to a bottom portion of the evaporator and has an upper end thereof attached to the top portion of the evaporator. The entrance for liquid corresponds to the upper end of the wick structure.

14 Claims, 2 Drawing Sheets

LOOP HEAT PIPE

CROSS-REFERENCE TO RELATED APPLICATION

This application is related to a copending U.S. patent application Ser. No. 12/632,769 filed on Dec. 7, 2009 and entitled "PLATE-TYPE HEAT PIPE", and having the same assignee as this application. The entire contents of the copending application are incorporated herein by reference.

BACKGROUND

1. Technical Field

The disclosure relates to heat dissipation devices and, more particularly, to a loop heat pipe for dissipating heat generated by an electronic component.

2. Description of Related Art

Loop heat pipes have excellent heat transfer performance due to their low thermal resistance, and are an effective means for transfer or dissipation of heat from heat-generating components such as central processing units (CPUs) of computers.

A typical loop heat pipe comprises an evaporator having a central region thereof thermally connected with an electronic component, a condenser, a vapor pipe and a liquid pipe. The vapor pipe and the liquid pipe connect the evaporator with the condenser. A wick structure adheres to an inner wall of the evaporator. A predetermined quantity of bi-phase working medium is contained in the evaporator. When a bottom of the evaporator absorbs heat from the heat-generating component, the working medium located at a lower portion of the evaporator is vaporized into vapor. The vapor moves up to an upper portion of the evaporator, and is condensed to liquid. The liquid flows back to the central region of the evaporator via capillary force of the wick structure.

However, when the vapor rises rapidly to the upper portion of the evaporator, the vapor may impact and disperse the liquid. Thus, a speed of the liquid flowing back to the central region of the evaporator is retarded. In addition, the evaporator is prone to become dried out, whereby it is no longer capable of providing an evaporation-condensation cycle for maximizing the effectiveness of the loop heat pipe.

What is needed, therefore, is a loop heat pipe which can overcome the above problems.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Figure 1:
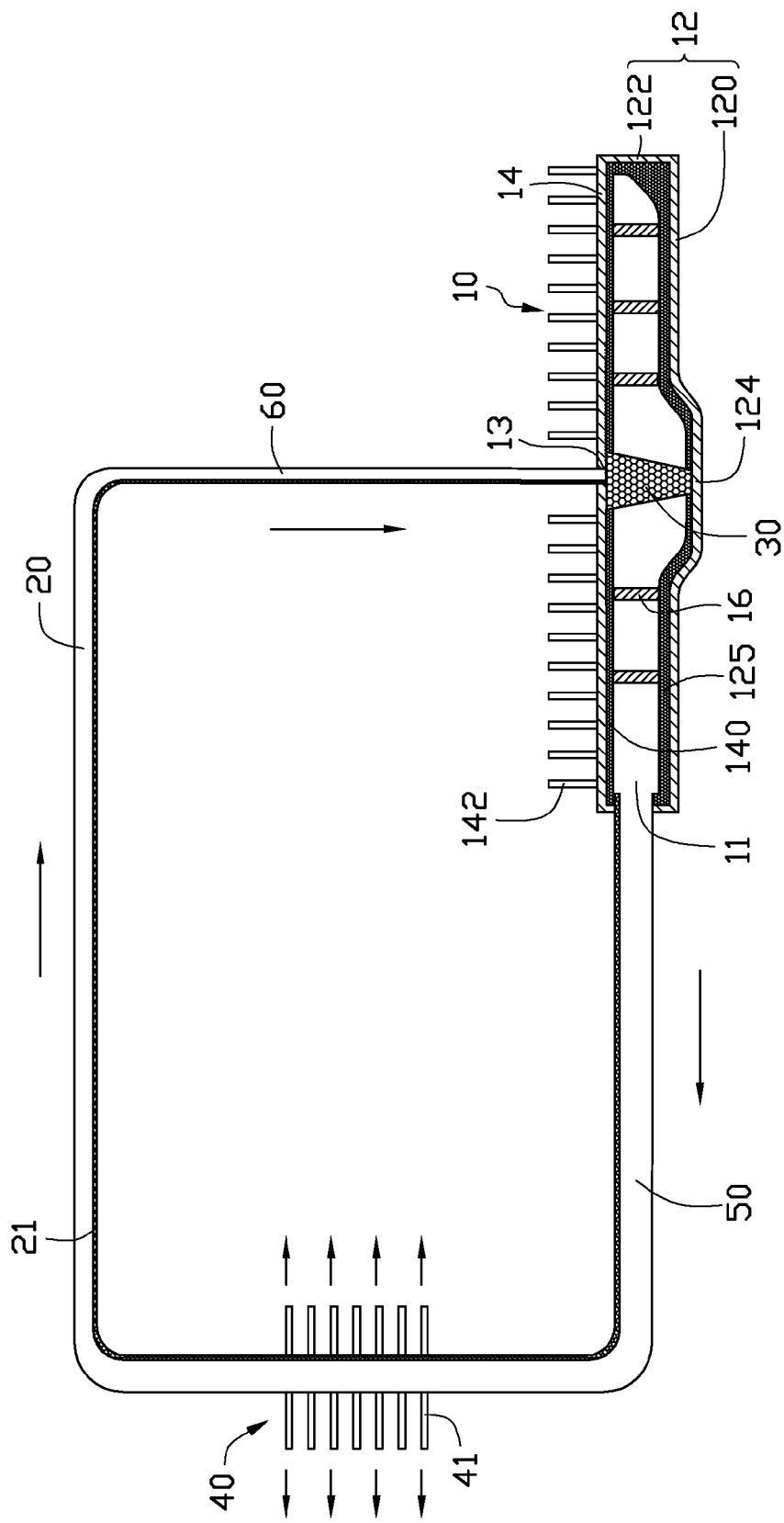
FIG. 1 is a cross-sectional view of a loop heat pipe in accordance with a first embodiment of the disclosure.

Referring to FIG. 1, a loop heat pipe in accordance with a first embodiment of the disclosure is illustrated. The loop heat pipe comprises a plate-type evaporator 10, a pipe 20, and a condenser 40 thermally connected with the pipe 20. The plate-type evaporator 10 has an exit 11 in a lateral portion thereof and an entrance 13 in a top portion thereof. Two free ends of the pipe 20 are connected with the exit 11 and the entrance 13, respectively, so that the pipe 20 and the evaporator 10 cooperatively form a closed loop. A predetermined quantity of bi-phase working medium is contained in the closed loop. The working medium is selected from a liquid which has a low boiling point, such as water, methanol, or alcohol.

The evaporator 10 is thermally connected with an electronic component, such as a central processing unit (CPU). The working medium in the evaporator 10 absorbs heat from the electronic component, and is vaporized into vapor. A vapor pressure is generated and propels the vapor through the exit 11 and into the pipe 20. The vapor is condensed into liquid by the condenser 40. The liquid flows back to the evaporator 10 through the entrance 13.

The evaporator 10 comprises a substantially bowl-shaped container 12, a plate-shaped cover 14 covering a top of the container 12, and a plurality of parallel and spaced supporting pillars 16 vertically positioned between the container 12 and the cover 14. The entrance 13 is defined in a central portion of the cover 14. A first wick structure 30 is vertically positioned in a central portion of the evaporator 10, and corresponds to the entrance 13. An upper end of the first wick structure 30 adheres to a part of the cover 14 around the entrance 13, and an opposite lower end adheres to the container 12.

The container 12 is made of material with high heat conductivity, such as aluminum or copper. The container 12 comprises a bottom wall 120, and a circumferential wall 122 extending upwardly and perpendicularly from a circumferential edge of the bottom wall 120. The exit 11 is defined in the circumferential wall 122. A central portion of the bottom wall 120 protrudes out of the evaporator 10, thereby forming a substantially rectangular heat-absorbing body 124 for being attached to the electronic component. A second wick structure 125 adheres to an inner surface of the container 12, which inner surface includes the bottom wall 120 and the circumferential wall 122. The second wick structure 125 adhering to the heat-absorbing body 124 is thinner than the second wick structure 125 adhering to other portions of the bottom wall 120, whereby the working medium permeating the thinner second wick structure 125 may be quickly vaporized into vapor.

The cover 14 engages with a top edge of the circumferential wall 122. The cover 14 may be made of material with high heat conductivity, such as aluminum or copper. A third wick structure 140 adheres to a bottom surface of the cover 14. When a part of the vapor flows up to the cover 14, the vapor is condensed into liquid by the third wick structure 140 and the cover 14. The third wick structure 140 guides the liquid along the bottom surface of the cover 14 back to the container 12. In this embodiment, the second and third wick structures 125, 140 are continuous. Thereby, the liquid may quickly flow from the bottom surface of the cover 14 back to the heat-absorbing body 124 via capillary force of the second and third wick structures 125, 140, for supplying enough liquid for the heat-absorbing body 124. A heat sink 142 is located at a top of the cover 14 in order to dissipate heat on the cover 14. In this embodiment, the heat sink 142 includes a plurality of parallel spaced fins (not labeled).

Each of the supporting pillars 16 is made of material with high rigidity and high heat conductivity, such as aluminum or copper. The supporting pillars 16 support the cover 14, and also conduct heat from the bottom wall 120 of the container 12 to the cover 14. In other embodiments, a wick structure (not shown) may adhere to an outer circumferential side of each supporting pillar 16, for guiding the liquid back to the bottom wall 120.

The first wick structure 30 is substantially frustoconical. For example, the first wick structure 30 can be a circular truncated cone in shape. The upper end of the first wick structure 30 is larger than the lower end. The upper end of the first wick structure 30 adheres to the cover 14, and covers the entrance 13 of the evaporator 10. The lower end of the first wick structure 30 adheres to a central region of the heat-absorbing body 124, which is typically located on a center of the heat source (electronic component). A horizontal section area of the lower end of the first wick structure 30 is smaller than an inner surface area of the heat-absorbing body 124. That is, the lower end of the first wick structure 30 has a smaller contact area with the heat-absorbing body 124. When the first wick structure 125 absorbs the liquid back to the heat-absorbing body 124, due to the smaller contact area, the liquid at a periphery of the central region can flow by means of, inter alia, gravity towards the central region to supply enough liquid for the central region, thereby preventing the central region from being evaporated out.

The pipe 20 is made of deformable material compatible with the working medium, such as aluminum, stainless steel, or copper. The pipe 20 comprises a vapor pipe 50, and a liquid pipe 60. The vapor pipe 50 connects the condenser 40 and the exit 11, and the liquid pipe 60 connects the condenser 40 and the entrance 13. In this embodiment, the vapor pipe 50 and the liquid pipe 60 are integrated in a single, continuous body that is the pipe 20. The condenser 40 condenses the vapor in the vapor pipe 50 into liquid. In this embodiment, the condenser 40 comprises a plurality of parallel spaced fins 41 coiled around the pipe 20. A fourth wick structure 21 adheres to an inner surface of the pipe 20. The fourth wick structure 21 can, for example, consist of porous structures, such as fine grooves integrally formed at the inner surface of the pipe 20, screen mesh or fiber inserted into the pipe 20, or sintered powders attached to the inner surface of the pipe 20 using a sintering process. The first, second and third wick structures 30, 125, 140 may be one type of the above-mentioned porous structures, or a combination of plural types of the above-mentioned porous structures. In other embodiments, the fourth wick structure 21 may just adhere to an inner surface of the liquid pipe 60, for guiding the liquid back to the evaporator 10 quickly.

In operation of the loop heat pipe of the first embodiment, a liquid working medium which permeates the thinner second wick structure 125 absorbs heat from the electronic component, and is vaporized into vapor.

A part of the vapor moves rapidly up to the cover 14, and is cooled by the third wick structure 140 and the heat sink 142 into liquid. One part of the liquid flows back to the central region of the heat-absorbing body 124 directly via the first wick structure 30. Another part of the liquid flows back to the bottom wall 120 of the container 12 via the supporting pillars 16. The other part of the liquid flows back to the central region of the heat-absorbing body 124 through the third wick structure 140 and the second wick structure 125 in that order by a capillary force of the second and third wick structures 140, 125.

The other part of the vapor is propelled by the vapor pressure into the vapor pipe 50 and toward the condenser 40. The vapor dissipates its heat to the condenser 40, and is condensed to liquid. The vapor pressure still exists since the evaporator 10 supplies the vapor continuously. The vapor pressure propels the liquid into the liquid pipe 60. The liquid in the liquid pipe 60 flows into the first wick structure 30 through the entrance 13 by capillary force of the fourth wick structure 21. The first wick structure 30 guides the liquid back to the central region of the heat-absorbing body 124, thereby supplying enough liquid for the heat-absorbing body 124 to prevent the central region of the heat-absorbing body 124 from being evaporated out. Due to the upper end of the first wick structure 30 larger than the lower end of the first wick structure 30, the upper end has a larger contact area with the third wick structure 140, whereby the liquid may be guided back to the central region of the heat-absorbing body 124 quickly.

Figure 2:
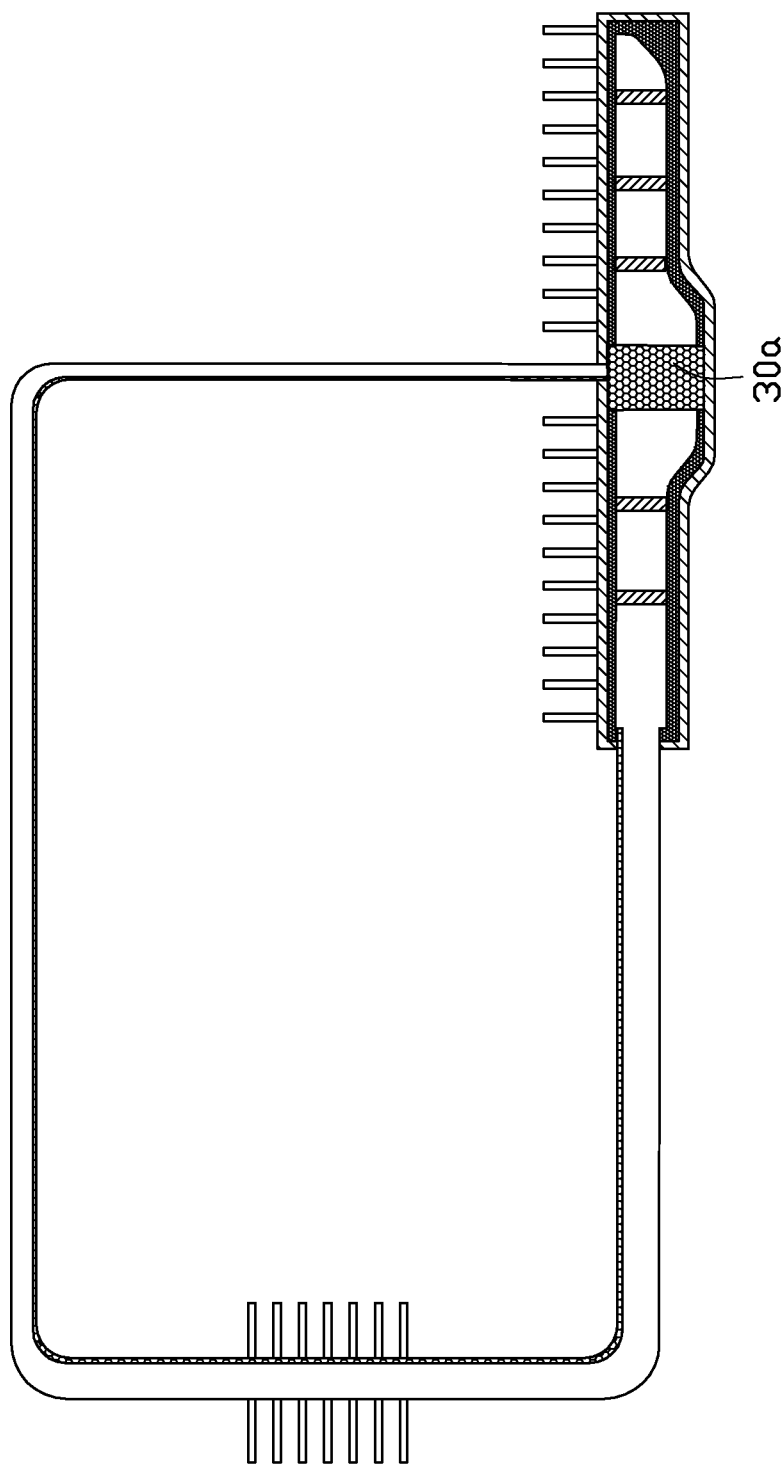
FIG. 2 is a cross-sectional view of a loop heat pipe in accordance with a second embodiment of the disclosure.

Referring to FIG. 2, a loop heat pipe in accordance with a second embodiment of the disclosure is illustrated. The loop heat pipe of the second embodiment is similar to the loop heat pipe of the first embodiment. The main difference is that in the loop heat pipe of the second embodiment, a first wick structure 30a is columnar in shape. In the illustrated embodiment, the first wick structure 30a has a uniform width.

It is to be understood, however, that even though numerous characteristics and advantages of the various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A loop heat pipe comprising:
   a plate-type evaporator comprising a container and a cover covering a top of the container, the container comprising a bottom wall and a circumferential wall extending upwardly from a circumferential edge of the bottom wall, an exit for vapor being defined in a lateral portion of the container, and an entrance for liquid being defined in the cover;
   a first wick structure having a lower end thereof attached to the bottom wall of the evaporator and having an upper end thereof attached to the cover of the evaporator, the entrance corresponding to the upper end of the first wick structure, and the first wick structure being spaced from the exit and the entire circumferential wall of the container, the wick structure having an upper end that is wider than a lower end;
   a pipe connecting the exit and the entrance to form a closed loop;
   a condenser thermally connected with the pipe and configured for condensing vapor into liquid; and
   a working medium contained in the closed loop.

2. The loop heat pipe of claim 1, wherein the bottom wall of the evaporator protrudes out to define a heat-absorbing body, the lower end of the first wick structure being attached to a central region of the heat-absorbing body.

3. The loop heat pipe of claim 2, wherein a transverse section area of the lower end of the first wick structure is smaller than an inner surface area of the heat-absorbing body.

4. The loop heat pipe of claim 3, wherein the first wick structure tapers from the upper end to the lower end.

5. The loop heat pipe of claim 3, wherein the first wick structure is columnar and has a substantially uniform width.

6. The loop heat pipe of claim 1, further comprising a heat sink positioned on top of the cover.

7. The loop heat pipe of claim 1, further comprising a second wick structure adhered to an inner surface of the bottom wall and the circumferential wall.

8. The loop heat pipe of claim 7, wherein a portion of the second wick structure adhering to the heat-absorbing body is thinner than another portion of the second wick structure adhering to other portions of the bottom wall.

9. The loop heat pipe of claim 7, further comprising a third wick structure adhered to a bottom surface of the cover.

10. The loop heat pipe of claim 9, wherein the second and third wick structures are continuous.

11. The loop heat pipe of claim 9, further comprising a fourth wick structure adhered to at least an inner surface of a part of the pipe close to the entrance.

12. The loop heat pipe of claim 11, wherein the fourth wick structure is adhered to an inner surface of substantially an entirety of the pipe.

13. The loop heat pipe of claim 1, wherein the condenser comprises a plurality of fins coiled around the pipe.

14. A loop heat pipe comprising:
   an evaporator defining an exit for vapor and an entrance for liquid, wherein the evaporator is a plate in shape;
   a frustoconical wick structure being vertically positioned in a central portion of the evaporator, an upper end of the wick structure being wider than a lower end of the wick structure, and the entrance corresponding to the upper end of the wick structure;
   a pipe connecting the exit and the entrance to form a closed loop;
   a condenser thermally connected with the pipe and configured for condensing the vapor into the liquid; and
   a working medium contained in the closed loop.

* * * * *